US012689390B2

(12) United States Patent
Kim et al.

(10) Patent No.: US 12,689,390 B2
(45) Date of Patent: Jul. 21, 2026

(54) HARDWARE OPTIMIZATION DEVICE AND METHOD FOR LOW-DENSITY PARITY CHECK DECODER

(71) Applicant: Electronics and Telecommunications Research Institute, Daejeon (KR)

(72) Inventors: Kwang Ok Kim, Daejeon (KR); Kyeong Hwan Doo, Daejeon (KR); Hwan Seok Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 9 days.

(21) Appl. No.: 18/823,609

(22) Filed: Sep. 3, 2024

(65) Prior Publication Data

US 2025/0240036 A1     Jul. 24, 2025

(30) Foreign Application Priority Data

Jan. 18, 2024     (KR) ........................ 10-2024-0008162

(51) Int. Cl.
*H03M 13/11*          (2006.01)
(52) U.S. Cl.
CPC ................................ *H03M 13/114* (2013.01)
(58) Field of Classification Search
CPC .................................................. H03M 13/114
See application file for complete search history.

(56) References Cited

U.S. PATENT DOCUMENTS 10,680,646 B2     6/2020  Richardson
10,778,371 B2     9/2020  Loncke et al.

10,999,004 B2     5/2021  Park et al.
11,245,490 B2     2/2022  Jing et al.
11,595,060 B2     2/2023  Kim
2007/0220398 A1*  9/2007  Moon ................ H03M 13/1131
                                              714/758
2009/0113256 A1*  4/2009  Radosavljevic ... H03M 13/1185
                                              714/699

(Continued)

FOREIGN PATENT DOCUMENTS

KR     10-2007-0062534 A     6/2007
KR     10-2007-0068675 A     7/2007

(Continued)

OTHER PUBLICATIONS

Notice of Allowance for KR 10-2024-0008162 by Ministry of Intellectual Property Office dated Dec. 23, 2025.

*Primary Examiner* — Joseph D Torres
(74) *Attorney, Agent, or Firm* — BROADVIEW IP LAW, PC

(57)                    ABSTRACT

A hardware optimization device for a low-density parity check (LDPC) decoder according to one embodiment of the present invention includes a variable node unit configured to update a variable node message delivered to each variable node, and a check node unit configured to update a check node message delivered to each check node, wherein the variable node unit and the check node unit divide a parity check matrix into N column blocks for the update (N is a natural number of 2 or more), repeatedly perform calculations for the variable node and the check node for each of the divided column blocks, and perform different calculations for variable nodes according to each of phases through a pipeline method.

20 Claims, 14 Drawing Sheets phase 1 CALCULATION
Stage 1 | Stage 2 | Stage 3 | Stage 4 | Stage 5 phase 2 CALCULATION
Stage 1 | Stage 2 | Stage 3 | Stage 4 | Stage 5 phase 69 CALCULATION
Stage 1 | Stage 2 | Stage 3 | Stage 4 | Stage 5

One iteration requires (# phases + # stages - 1) cycles

(56)                    References Cited

U.S. PATENT DOCUMENTS

| | | | | |
|---|---|---|---|---|
| 2011/0161770 A1* | 6/2011 | Ueng | .................... | H03M 13/13 |
| | | | | 714/752 |
| 2013/0212450 A1* | 8/2013 | Sham | ................ | H03M 13/1154 |
| | | | | 714/E11.034 |
| 2016/0142074 A1* | 5/2016 | Sham | .................. | H03M 13/116 |
| | | | | 714/776 |
| 2016/0197701 A1* | 7/2016 | Kim | .................. | H03M 13/1111 |
| | | | | 714/776 |

FOREIGN PATENT DOCUMENTS

| | | | |
|---|---|---|---|
| KR | 10-2019-0071728 A | 6/2019 |
| KR | 10-2020-0003829 A | 1/2020 |
| KR | 10-2020-0090232 A | 7/2020 |
| KR | 10-2020-0122064 A | 10/2020 |
| KR | 10-2022-0064187 A | 5/2022 |
| KR | 10-2023-0076805 A | 5/2023 |
| KR | 10-2023-0164328 A | 12/2023 |
| WO | 2022/102843 A1 | 5/2022 |

* cited by examiner

| VNU 256 | ⋮ | VNU 1 | | VNU 256 | ⋮ | VNU 1 | VNU 256 | ⋮ | VNU 1 |
|---------|---|-------|---|---------|---|-------|---------|---|-------|

H1, 69

H12, 69

T69

⋮

H1, 1

H12, 1

T1

CNU 1  CNU 2

⋯

CNU 3072

FIG. 14

HARDWARE OPTIMIZATION DEVICE AND METHOD FOR LOW-DENSITY PARITY CHECK DECODER

CROSS-REFERENCE TO RELATED APPLICATION

This application claims priority to and the benefit of Korean Patent Application No. 10-2024-0008162, filed on Jan. 18, 2024, the disclosure of which is incorporated herein by reference in its entirety.

BACKGROUND

1. Field of the Invention

Embodiments of the present invention relate to a hardware optimization device and method for a low-density parity check (LDPC) decoder in a 50G passive optical network (PON).

2. Discussion of Related Art

The ITU-T SG15 working group standardized the $1^{st}$ generation 2.5G passive optical network (PON), the $2^{nd}$ generation 10G PON, and the $3^{rd}$ generation 50G PON. In the 1st and 2nd generation PON standards, read solomon (RS) type error correction codes are used, and it can provide an output BER (bit error rate) of 1E-12 at an input BER of 1E-3. An RS (248, 216) encoding code may be used for error correction, and an encoding code may correct 16-bit errors per codeword by adding a 32-byte parity to every 216-byte data input. An RS code may be relatively simple and thus may be implemented without significant restrictions on hardware resources.

Recent 25G PON and 50G PON standards use a low-density parity check (LDPC) encoding/decoding method to improve error correction performance. An LDPC method provides 1E-12 error correction performance at a 1E-2 BER reference level. Therefore, in order to achieve excellent error correction performance, an LDPC method requires relatively much higher complexity than an RS method.

An LDPC method is an error correction decoding technology based on a computational complexity maintenance parity check matrix in which error correction ability is improved by increasing a code length. In the 25G PON and the 50G PON, LDPC (17280, 14592) codes are used for error correction, and a 2688-bit parity is added to every 14592-bit data input. LDPC exhibits performance close to channel capacity based on a repetitive message propagation decoding algorithm and is being used in various fields.

An LDPC decoding algorithm generally proceeds through a repeated message delivery between a variable node and a check node within a code expressed in the form of a tanner graph. A decoding algorithm is divided into soft-decision decoding and hard-decision decoding according to a type of channel input message. In general, a hard-decision type bit-flipping algorithm is preferred as a low-complexity decoding algorithm, but its use is limited due to its relatively low error correction performance.

The present invention provides excellent error correction by updating a log-likelihood ratio (LLR) of each bit through iterative decoding using a soft-decision type normalized min-sum algorithm. However, since such an algorithm should satisfy a high-speed timing to perform iterative decoding within a limited cycle, a hardware optimization method for an LDPC decoder is required.

The background technology of the present invention is disclosed in Korean Patent Publication No. 10-2023-0164328 (published on Dec. 4, 2023).

SUMMARY OF THE INVENTION

The present invention is directed to providing a hardware optimization device and method for a low-density parity check (LDPC) decoder, which is capable of ensuring error correction performance while optimally using hardware resources in a 50G passive optical network (PON).

The technical problems to be solved by the present invention are not limited to the above-described problem(s), and any other technical problem(s) not described herein will be clearly understood from the following description by those of ordinary skill in the art.

According to an aspect of the present invention, there is provided a hardware optimization device for an LDPC decoder including a variable node unit configured to update a variable node message delivered to each variable node, and a check node unit configured to update a check node message delivered to each check node, wherein the variable node unit and the check node unit divide a parity check matrix into N column blocks for the update (N is a natural number of 2 or more), repeatedly perform calculations for the variable node and the check node for each of the divided column blocks, and perform different calculations for variable nodes according to each of phases through a pipeline method.

The phase may be an operation for each of the column blocks and may be used as many times as the number of the column blocks for one iterative decoding.

The variable node unit and the check node unit may make the phase into a plurality of pipeline stages and may consecutively perform two adjacent phase calculations with a timing offset as much as one clock cycle corresponding to one stage of the plurality of pipeline stages.

The variable node unit and the check node unit may increase the number of possible iterative decodings within a given time through parallelization of the parity check matrix based on grouping of the column blocks.

The variable node unit and the check node unit may group the N column blocks to constitute M phases (M is a natural number of 2 or more).

The variable node unit and the check node unit may perform log-likelihood ratio (LLR) update of each bit of the variable node message and the check node message through iterative decoding using the M phases and may perform error correction in a given clock cycle.

Each of the phases may be provided such that the maximum number of each of check nodes and variable nodes is determined according to a grouping number of the column blocks.

The variable node unit and the check node unit may constitute iterative decoding by delivering the updated message to an adjacent node through an edge connecting the variable node and the check node.

When a value of the parity check matrix is 1, the edge may be connected between the variable node and the check node.

In order to optimize hardware resources, the variable node unit and the check node unit may define a bit width of each of a channel log-likelihood ratio (LLR), a soft LLR message (VCM) delivered from the variable node unit to the check node unit, and a soft LLR message (CVM) delivered from the check node unit to the variable node unit with 4 bits including a sign bit, wherein, for an internal calculation, the variable node unit defines the bit width of each of the channel LLR, the VCM, and the CVM with 7 bits including the sign bit.

According to another aspect of the present invention, there is provided a hardware optimization method for an LDPC decoder including dividing a parity check matrix into N column blocks; and repeatedly performing calculations for the variable node and the check node for each of the divided column blocks, wherein different calculations for variable nodes are performed according to each of phases through a pipeline method.

The phase may be an operation for each of the column blocks and may be used as many times as the number of the column blocks for one iterative decoding.

The variable node unit and the check node unit may make the phase into a plurality of pipeline stages and may consecutively perform two adjacent phase calculations with a timing offset as much as one clock cycle corresponding to one stage of the plurality of pipeline stages.

The variable node unit and the check node unit may increase the number of possible iterative decodings within a given time through parallelization of the parity check matrix based on grouping of the column blocks.

The variable node unit and the check node unit may group the N column blocks to constitute M phases.

The variable node unit and the check node unit may perform LLR update of each bit of the variable node message and the check node message through iterative decoding using the M phases and may perform error correction in a given clock cycle.

Each of the phases may be provided such that the maximum number of each of check nodes and variable nodes is determined according to a grouping number of the column blocks.

The variable node unit and the check node unit may constitute iterative decoding by delivering the updated message to an adjacent node through an edge connecting the variable node and the check node.

When a value of the parity check matrix is 1, the edge may be connected between the variable node and the check node.

In order to optimize hardware resources, the variable node unit and the check node unit may define a bit width of each of a channel LLR, a soft LLR message (VCM) delivered from the variable node unit to the check node unit, and a soft LLR message (CVM) delivered from the check node unit to the variable node unit with 4 bits including a sign bit, wherein, for an internal calculation, the variable node unit defines the bit width of each of the channel LLR, the VCM, and the CVM with 7 bits including the sign bit.

Specific details of other embodiments are included in the detailed description and the accompanying drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 2 is a diagram illustrating a frame transmission structure through LDPC encoding/decoding in a 50G passive optical network (PON);

FIG. 9 is a diagram illustrating a pipeline configuration concept of a parity check matrix of an LDPC decoder according to the present invention;

FIG. 14 is a diagram illustrating a structure of a third stage of parallelization of a parity check matrix according to the present invention.

DETAILED DESCRIPTION OF EXEMPLARY EMBODIMENTS

Figure 1:
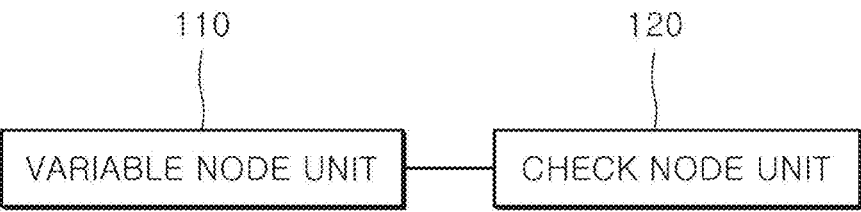
FIG. 1 is a block diagram illustrating a hardware optimization device for a low-density parity check (LDPC) decoder according to one embodiment of the present invention.

Hereinafter, embodiments of the present invention will be described in detail with reference to the accompanying drawings so that those skilled in the art may easily practice the present invention. However, the present invention may be implemented in various forms and is not limited to the embodiments described herein. In the accompanying drawings, portions unrelated to the description will be omitted in order to obviously describe the present invention, and similar reference numerals will be used to describe similar portions throughout the present specification.

Throughout the specification, unless explicitly described to the contrary, the word "comprise" and variations such as "comprises" or "comprising" will be understood to imply the inclusion of stated elements but not the exclusion of any other elements.

Implementations described herein may be implemented in, for example, a method or process, an apparatus, a software program, a data stream, or a signal. Although discussed only in the context of a single form of implementation (e.g., discussed only as a method), implementations of the discussed features may also be implemented in other forms (for example, an apparatus or a program). The apparatus may be implemented in suitable hardware, software, firmware, and the like. A method may be implemented in an apparatus such as a processor, which is generally a computer, a microprocessor, an integrated circuit, a processing device including a programmable logic device, or the like.

FIG. 1 is a block diagram illustrating a hardware optimization device for a low-density parity check (LDPC) decoder according to one embodiment of the present invention.

Referring to FIG. 1, a hardware optimization device 100 for an LDPC decoder according to one embodiment of the present invention may include a variable node unit (VNU) 110 and a check node unit (CNU) 120.

The VNU 110 may update a variable node message (CVM) delivered to each variable node (VN), and the CNU 120 may update a check node message (VCM) delivered to each check node (CN).

The VNU 110 and the CNU 120 may divide a parity check matrix into N column blocks (N is a natural number of 2 or more) for message update and may repeatedly perform calculations for a variable node and a check node for each divided column block. To this end, the VNU 110 and the CNU 120 may perform different calculations for variable nodes according to each phase through a pipeline method.

The VNU 110 and the CNU 120 may constitute iterative decoding by delivering an updated message to an adjacent node through an edge connecting the variable node and the check node. When a value of the parity check matrix is 1, the edge may be connected between the variable node and the check node.

In order to optimize hardware resources, the VNU 110 and the CNU 120 may define a bit width of each of a channel log-likelihood ratio (LLR), a soft LLR message (VCM) delivered from the VNU 110 to the CNU 120, and a soft LLR message (CVM) delivered from the CNU 120 to the VNU 110 with 4 bits including a sign bit.

In this case, for an internal calculation, the VNU 110 may define the bit width of each of the channel LLR, the VCM, and the CVM with 7 bits (including a sign bit).

The VNU 110 and the CNU 120 may make a phase into a plurality of pipeline stages. A phase is an operation for each column block, and the same number of phases as column blocks may be used for one iterative decoding.

The VNU 110 and the CNU 120 may consecutively perform two adjacent phase calculations with a timing offset as much as one clock cycle corresponding to one stage of the plurality of pipeline stages.

The VNU 110 and the CNU 120 may increase the number of possible iterative decodings within a given time through parallelization of a parity check matrix based on the grouping of column blocks.

The VNU 110 and the CNU 120 may group N column blocks to constitute M phases (M is a natural number of 2 or more). The VNU 110 and the CNU 120 may perform LLR update of each bit of the CVM and the check node message (VCM) through iterative decoding using the M phases, thereby correcting an error in a given clock cycle.

In this case, each phase may be provided such that the maximum number of each of check nodes and variable nodes is determined according to the grouping number of column blocks.

The device described above may be implemented using hardware components, software components, and/or a combination of hardware components and software components. For example, devices and components described in embodiments may be implemented using one or more general-purpose or special-purpose computers, such as a processor, a controller, an arithmetic logic unit (ALU), a digital signal processor, a microcomputer, a field programmable gate array (FPGA), a programmable logic unit (PLU), a microprocessor, or any other devices capable of executing and responding to instructions. A processing device may perform an operating system (OS) and one or more software applications executed on the OS. In addition, the processing device may access, store, manipulate, process, and generate data in response to the execution of software. For convenience of understanding, one processing device is illustrated as being used, but a person having ordinary skill in the art may understand that the processing device may include a plurality of processing elements and/or a plurality of types of processing elements. For example, the processing device may include a plurality of processors or one processor and one controller. In addition, a different processing configuration, such as a parallel processor, is also possible.

Software may include a computer program, a code, an instruction, or a combination of one or more thereof and may configure or independently or collectively instruct a processing device to operate as desired. Software and/or data may be embodied permanently or temporarily in any type of machine, component, physical or virtual equipment, computer storage medium or device, or in a transmitted signal wave so as to be interpreted by a processing device or provide instructions or data to the processing device. The software also may be distributed over network coupled computer systems so that the software may be stored and executed in a distributed fashion. The software and data may be stored on one or more computer-readable recording media.

Hereinafter, a hardware optimization method for an LDPC decoder according to one embodiment of the present invention will be described.

Figure 2:
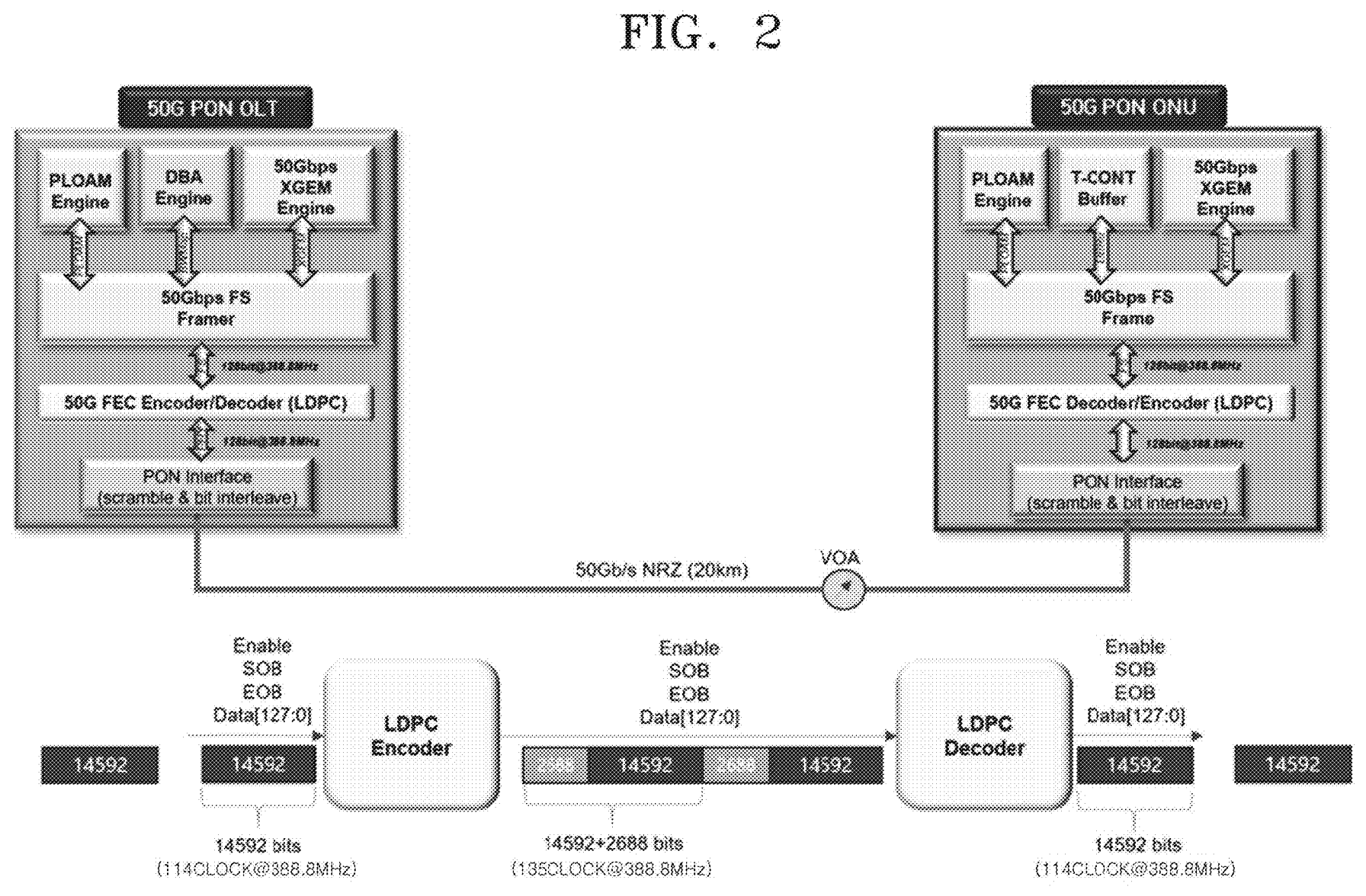

FIG. 2 is a diagram illustrating a frame transmission structure through LDPC encoding/decoding in a 50G passive optical network (PON).

Referring to FIG. 2, a 128-bit data bus and a 388.8 MHz clock are used to provide 50 Gbps performance in the 50G PON. Therefore, in the 50G PON, an LDPC encoder receives 14592-bit data through 114 clocks and transmits one codeword, to which a 2688-bits parity is added, for each 135 clock cycle.

On the other hand, a codeword is input for each 135 clock cycle, error correction is performed, and then an LDPC decoder transmits only 14592-bit data for 114 clock cycles. Therefore, in the 50G PON, the LDPC decoder is required to perform error correction within 135 clock cycles. In addition, an LDPC encoding logic should operate within a 388.8 MHz clock timing.

Figure 3:
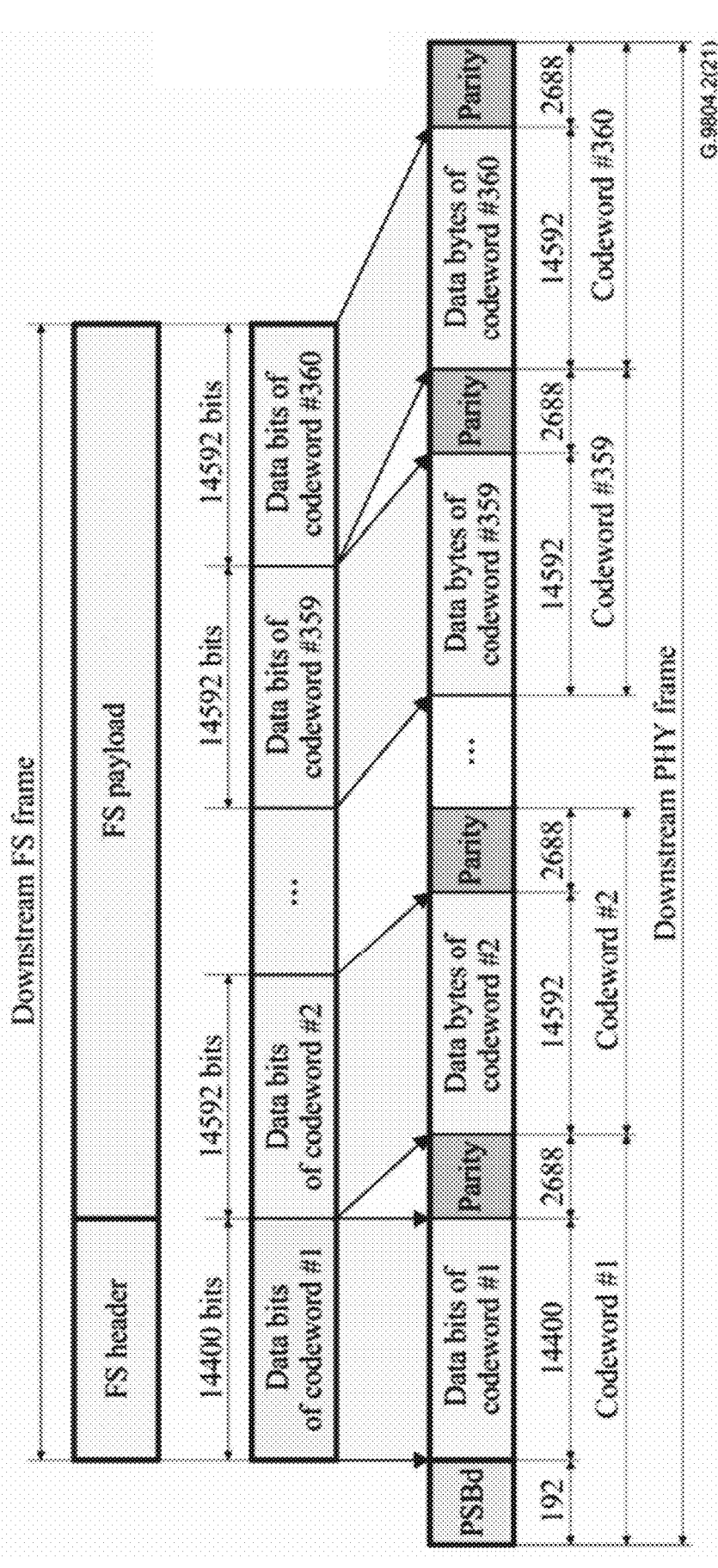
FIG. 3 is a diagram illustrating a 50G PON downlink frame transmission method based on an LDPC encoding method according to the International Telecommunications Union Telecommunication (ITU-T) standard.

FIG. 3 is a diagram illustrating a 50G PON downlink frame transmission method based on an LDPC encoding method according to the International Telecommunications Union Telecommunication (ITU-T) standard.

As shown in FIG. 3, in a 50G PON, 360 codewords are transmitted to a downlink for each 125 us period.

Figure 4:
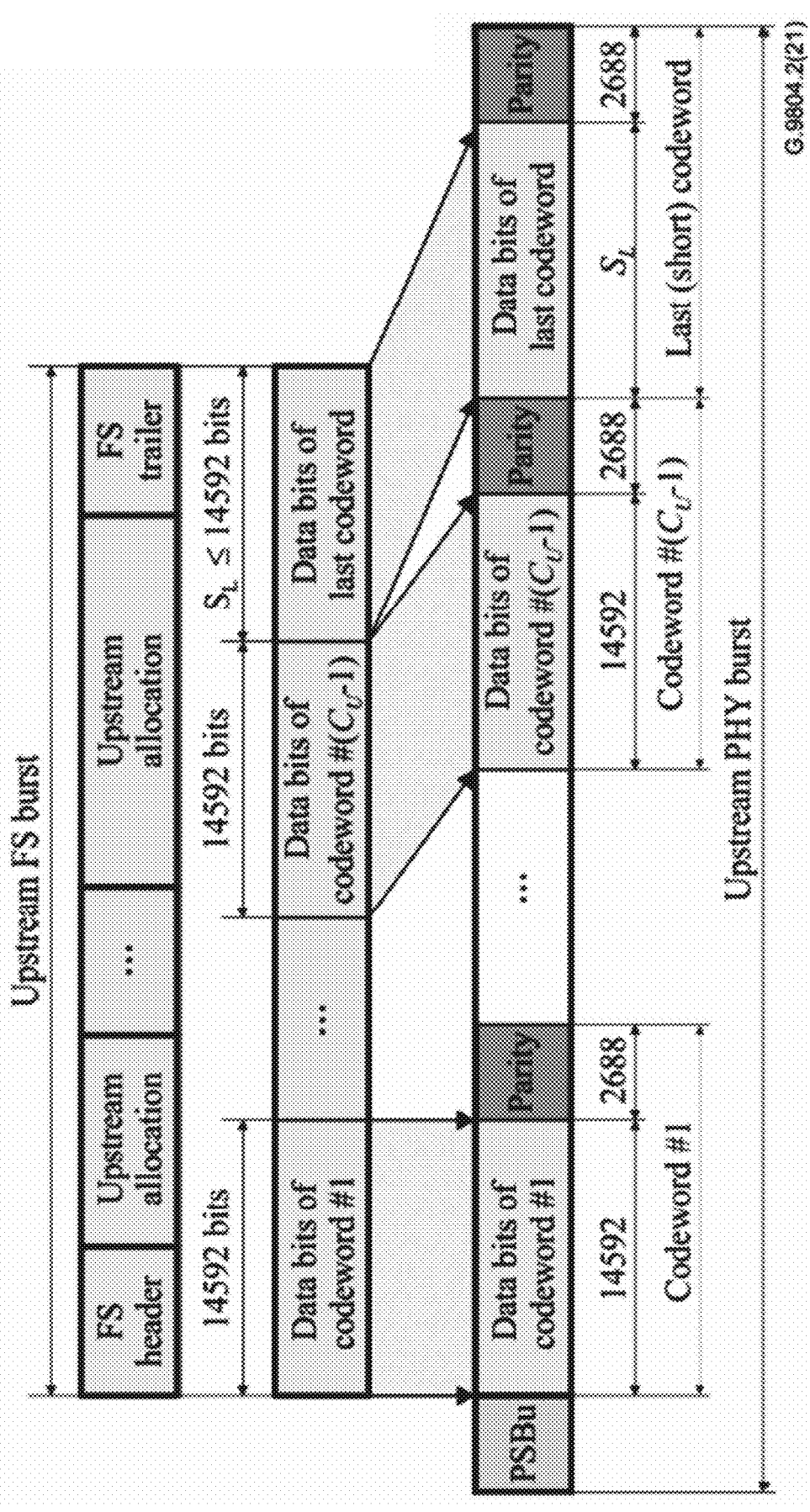
FIG. 4 is a diagram illustrating a 50G PON uplink frame transmission method based on an LDPC encoding method according to the ITU-T standard.

FIG. 4 is a diagram illustrating a 50G PON uplink frame transmission method based on an LDPC encoding method according to the ITU-T standard.

As shown in FIG. 4, in a 50G PON, shortened codewords are used to uplink for each 125 us period according to a size of a byte allocated to each optical network unit (ONU). Shorting is a method in which a parity is calculated with zero padding as many as the number of insufficient data bits and is transmitted when transmitted by deleting zero padding data.

Figure 5:
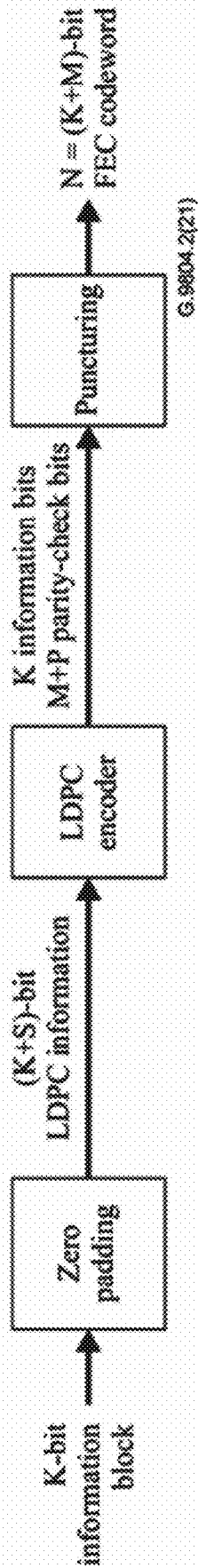
FIG. 5 is a diagram illustrating an LDPC encoding method specified in the ITU-T standard.

FIG. 5 is a diagram illustrating an LDPC encoding method specified in the ITU-T standard.

As shown in FIG. 5, the LDPC encoding method is as follows.

1. Generation of K-bit information block: $u=[u_0 \ u_1 \ \ldots \ u_{k-1}]$

2. Generation of LDPC information block after S-bit zero padding: u*=[u|0 0 . . . 0]=K+S=14,592
3. Generation of M+P parity bits in LDPC encoder: p=C(u*)=[p₁|p₂]=[[p₁ p₂ · · · p_{M−1}|p_M · · · p_{M+p−1}]=M+P=3,072 (M=2,688 and P=384), wherein P is the number of puncturing bits
4. Generation of tentative codeword: v*=[u*|p]=K+S+M+P=17,664, wherein v* satisfies Hv*$^T$=0. Size of parity check matrix H=(M+P)×(K+S+M+P)=3,072×17,664 bits
5. Shorting application (removal of zero padding): v=[u|p]=K+M+P
6. Puncturing amplification (removal of P parity)
7. Generation of codeword: c=[u₀ u₁ . . . u_{k−1}|p₀ p₁ · · · p_{M−1}]=K+M=17,280 bits In a 50G PON, a media access control (MAC) function is implemented through an application-specific integrated circuit (ASIC) or a field-programmable gate array (FPGA). As shown in FIG. 5, an LDPC decoding module probabilistically retrieves error data from the original data through a calculation with a parity check matrix H with a 3,072×17,664 size. In order to increase the probability thereof, an iterative decoding algorithm is used, which causes a logic size to increase exponentially. In addition, since an LDPC decoder should satisfy a high-speed timing to perform iterative decoding within a limited cycle, a hardware optimization method for the LDPC decoder is required.

Accordingly, the present invention proposes a hardware optimization method for an LDPC decoder through a pipeline method and parallelization of a sparse parity check matrix in a 50G PON.

Figure 6:
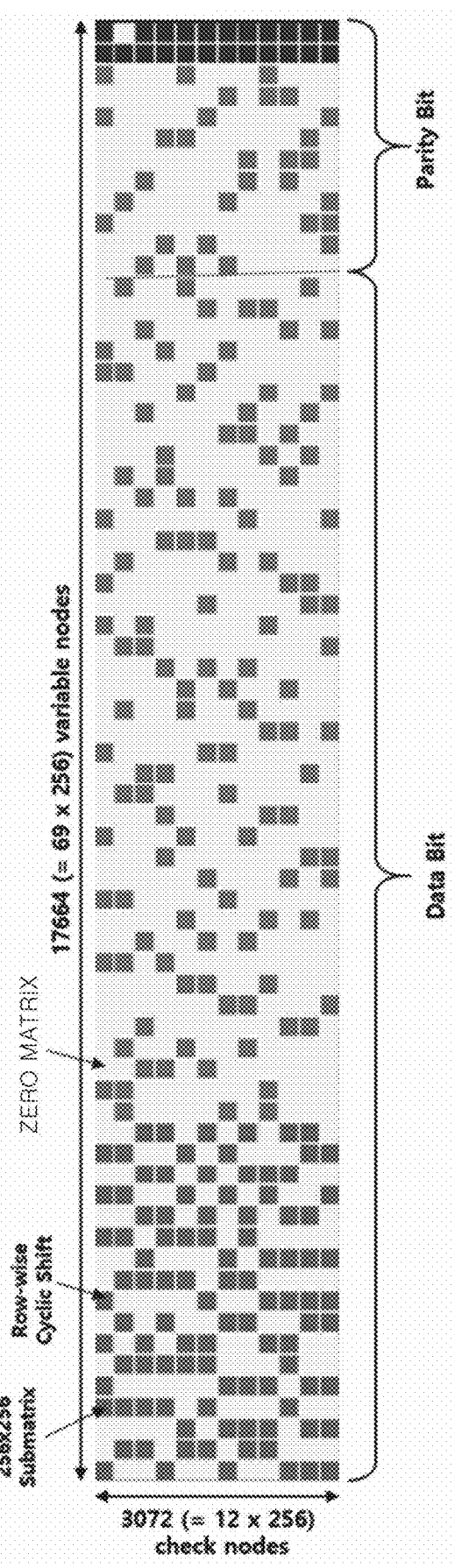
FIG. 6 is a diagram illustrating a parity check matrix structure with a 69×12 size used in a 50G PON.

FIG. 6 is a diagram illustrating a parity check matrix structure with a 69×12 size used in a 50G PON.

In an LDPC decoder, a parity check matrix calculation is very important. As shown in FIG. 6, each block is expressed in a matrix structure of a 256×256 submatrix. In addition, each block has a sparse matrix form to have a low-density structure. Light-colored blocks indicate a zero matrix, and dark-colored blocks indicate a cyclic shift of a unit matrix. For cyclic shift values in each block, an ITU-T standard document is referred.

Figure 7:
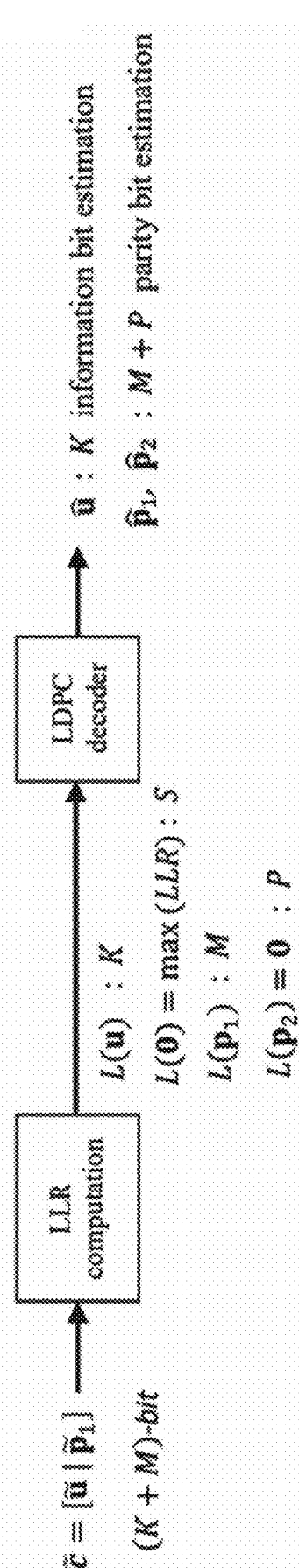
FIG. 7 is a diagram illustrating an LDPC decoding method according to the present invention.

FIG. 7 is a diagram illustrating an LDPC decoding method according to the present invention.

Referring to FIG. 7, the LDPC decoding method is as follows.

1. LDPC encoding codeword: c=[u|p₁] passes through an optical channel and then is input to an LDPC encoder as a 1/0 value through a photo detector and a demodulator.
2. Channel $$LLR = \log \frac{p(0)}{p(1)}$$

is calculated.

3. u* is estimated from a channel LLR of v*=[u*|p] through iterative decoding.
4. Since a zero padding bit is not transmitted and thus has a value of 0, an LLR is assigned with a maximum value.
5. In a parity bit of p=[p₁|p₂], p₂ is punctured and thus is not transmitted, and thus a receiving end cannot obtain information about a corresponding bit from a channel output. Therefore, a channel LLR of the punctured parity bit p₂ is assigned with 0.

LDPC decoding according to the present invention is constituted by a variable node, a check node, and an edge connecting the variable node and the check node. Each variable node and each check node update a message related to a bit using messages delivered thereto and then deliver the updated message to an adjacent node through the edge to constitute iterative decoding.

That is, the LDPC decoding according to the present invention is performed by repeatedly updating and delivering the message. As shown in FIG. 6, a 50G PON consists of 17,664 variable nodes and 3,072 check nodes, and when a value of a parity check matrix is 1, an edge is connected between the variable nodes. In the LDPC decoder, a total of 70,400 edges are connected.

Figure 8:
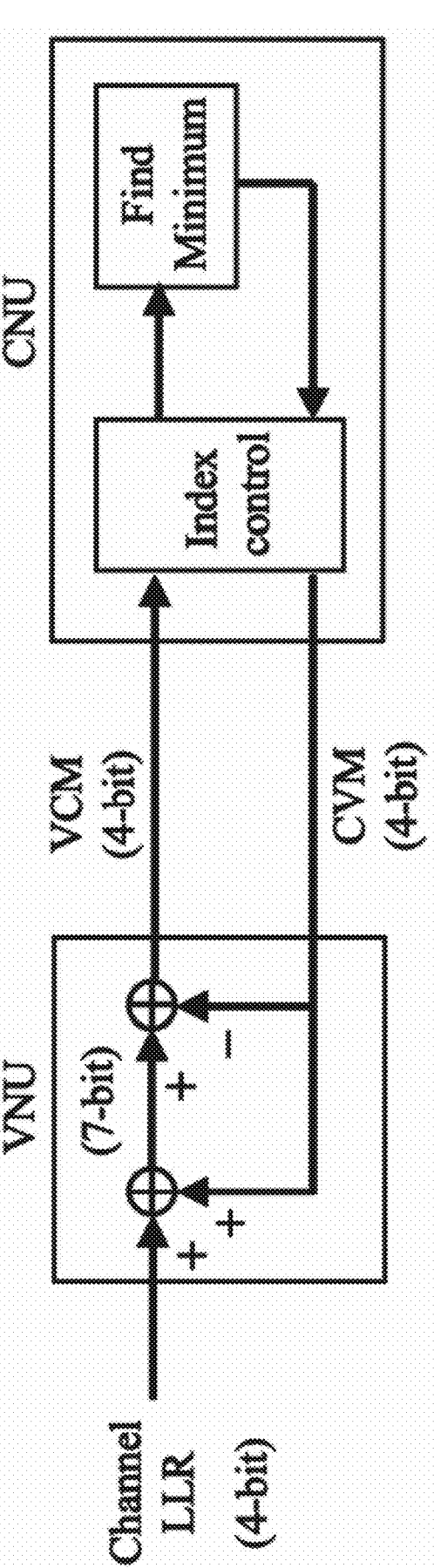
FIG. 8 is a diagram illustrating a basic configuration of an LDPC decoder according to the present invention.

FIG. 8 is a diagram illustrating a basic configuration of an LDPC decoder according to the present invention.

As shown in FIG. 8, the LDPC decoder consists of a VNU that updates a variable node message, and a CNU that serves to update a check node message. A soft LLR message delivered from the VNU to the CNU is referred to as a VCM, and a soft LLR message delivered from the CNU to the VNU is referred to as a CVM.

In the present invention, in order to optimize hardware resources, a bit width of each of the channel LLR, the VCM, and the CVM is defined with 4 bits including a sign bit. In addition, in the present invention, for calculations performed inside the VNU, the bit width of each of the channel LLR, the VCM, and the CVM is defined with 7 bits including a sign bit. In addition, in the present invention, in order to reduce the implementation complexity of the channel LLR and reduce overhead in actual operation, a channel error measurement process is omitted and an LLR value corresponding to channel error 1E-2 is applied.

In order to implement LDPC decoder hardware used in a 50G PON, a variable node of each of 70,400 connection points performs addition calculations for the CVM and the channel LLR, and a check node thereof performs a calculation for finding a minimum value. As shown in FIG. 8, since the CVM and the VCM are expressed in 4 bits, the numbers of adders required for addition calculations for the CVM and the channel LLR at the variable node and a comparison calculation for finding the minimum value at the check node are each 282,000, and thus a total of 560,000 adders are required. Thus, considerably high hardware resources are used.

In the present invention, in order to optimize hardware resources of the LDPC decoder, by using properties in which there are 256 connections between variable nodes and check nodes that do not overlap each other in a sub-graph corresponding to each submatrix of a parity check matrix H, blocks for updating a variable node message and a check node message may be implemented in a universal structure.

Figure 9:
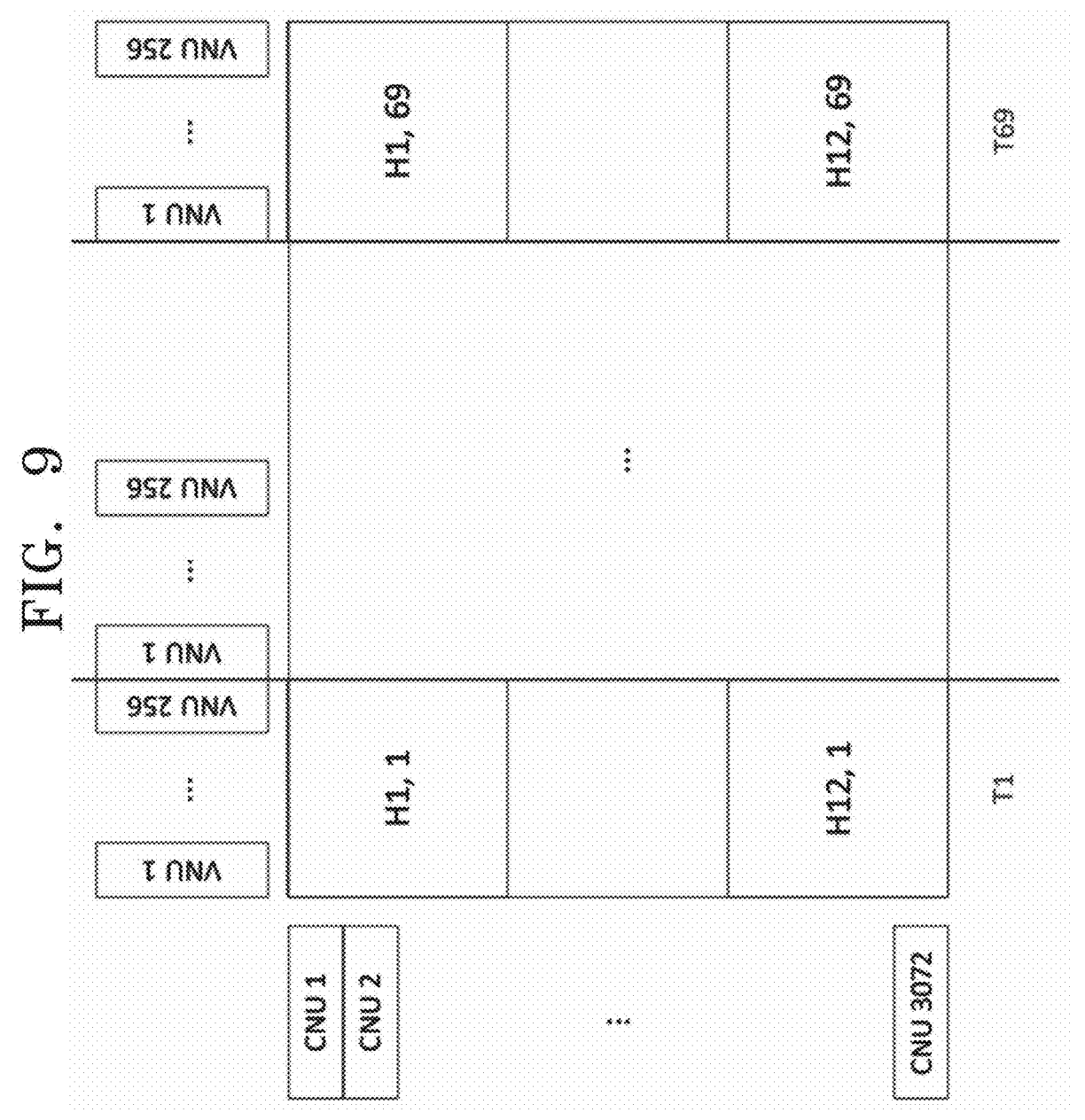

FIG. 9 is a diagram illustrating a pipeline configuration concept of a parity check matrix of an LDPC decoder according to the present invention.

As shown in FIG. 9, each divided column block consists of 256 variable nodes and 3,072 check nodes. Calculations for a variable node and a check node are performed by VNU and CNU blocks. Such a process is repeatedly performed on 69 column blocks, and through a pipeline method in hardware, a VNU and a CNU perform different calculations for variable nodes according to each phase by a control signal. A phase is referred to as an operation for a 12×1 column block. Therefore, 69 phases are used for one iterative decoding.

Figure 10:
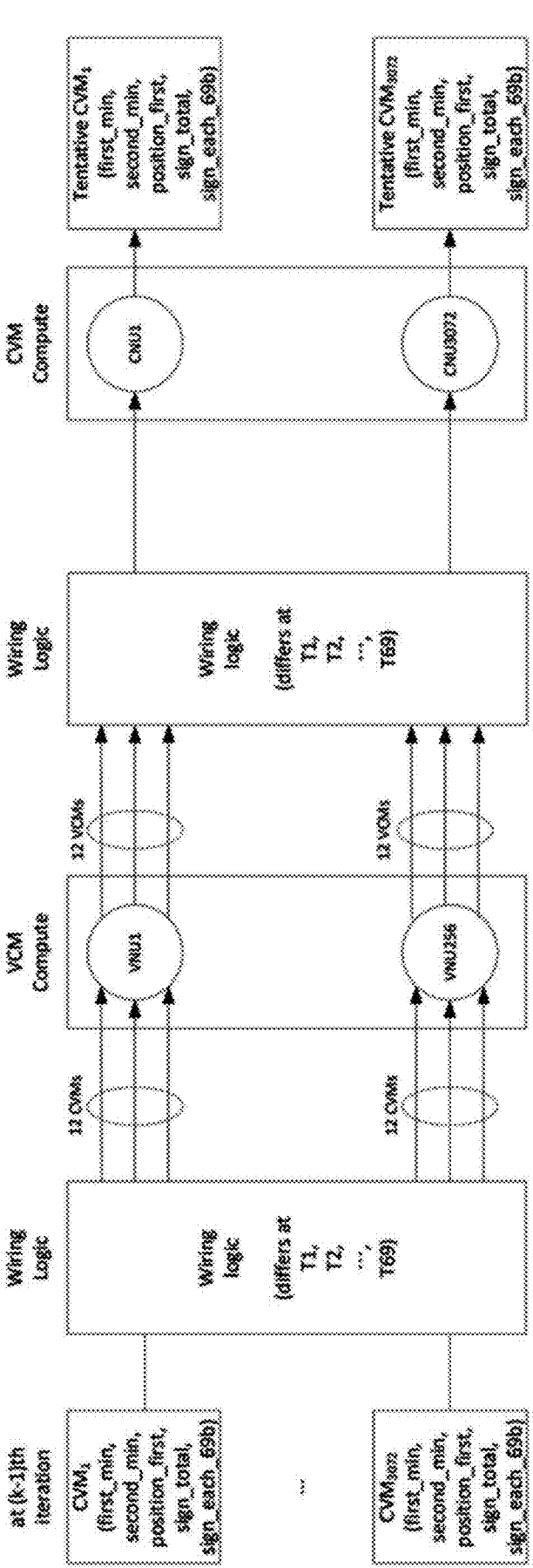
FIG. 10 is a diagram illustrating a phase configuration consisting of five pipeline stages according to the present invention.
Figure 11:
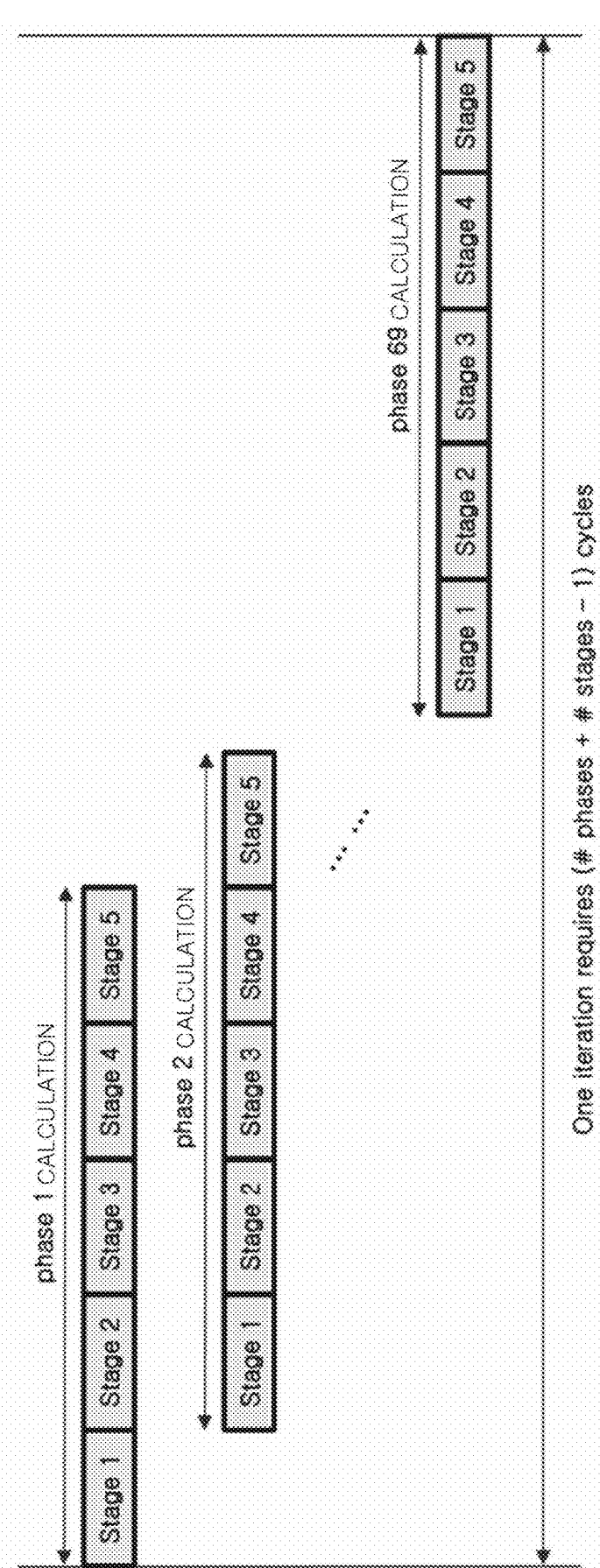
FIG. 11 is a diagram illustrating a procedure of performing a pipeline method phase of an LDPC decoder according to the present invention.

FIG. 10 is a diagram illustrating a phase configuration consisting of five pipeline stages according to the present invention. FIG. 11 is a diagram illustrating a procedure of performing a pipeline method phase of an LDPC decoder according to the present invention.

As shown in FIG. 10, a VNU operates in a three-stage pipeline method, and a CNU operates in a two-stage pipeline method. Each stage calculation is performed within one clock cycle.

Therefore, as shown in FIG. 11, two adjacent phase calculations are consecutively performed with a timing offset as much as one clock cycle corresponding to one stag. Therefore, in implementing an LDPC decoder, 69 phases are used for one iterative decoding, and thus 73 clock cycles are used. Since a codeword is input to the LDPC decoder for each 135 clock cycle, the LDPC decoder has no choice but to provide iterative decoding less than twice.

In order to solve such a problem, after a plurality of LDPC decoder units consisting of 69 phases are implemented in parallel, inputs are sequentially performed on parallel units to perform iterative decoding in each unit. However, in this case, an amount of use of hardware resources increases in proportion to the number of parallel blocks. Therefore, as the number of iterative decoding increases, hardware complexity increases.

In order to solve such a problem, the present invention proposes a parallelization structure. Thus, in the present invention, bit error rate (BER) performance can be improved by increasing the number of possible iterative decodings within a given time.

Figure 12:
FIG. 12 is a diagram illustrating a structure of a first stage of parallelization of a parity check matrix according to the present invention.

FIG. 12 is a diagram illustrating a structure of a first stage of parallelization of a parity check matrix according to the present invention.

As shown in FIG. 12, in the first stage of parallelization, 69 column blocks are grouped into a total of 26 phases. In this case, each phase is provided such that the number of each of check nodes and variable nodes is up to 1. Accordingly, the number of variable nodes connected to each check node in each phase is 1 or 0. In the first stage of parallelization, 26 phases are used, and thus 30 clock cycles are used for one iterative decoding. Therefore, the first stage of parallelization may provide four iterative decodings within 135 clock cycles. That is, in the present invention, when the first stage of parallelization is used, the number of iterative decodings may be expanded by two times while a hardware resource is slightly increased.

Figure 13:
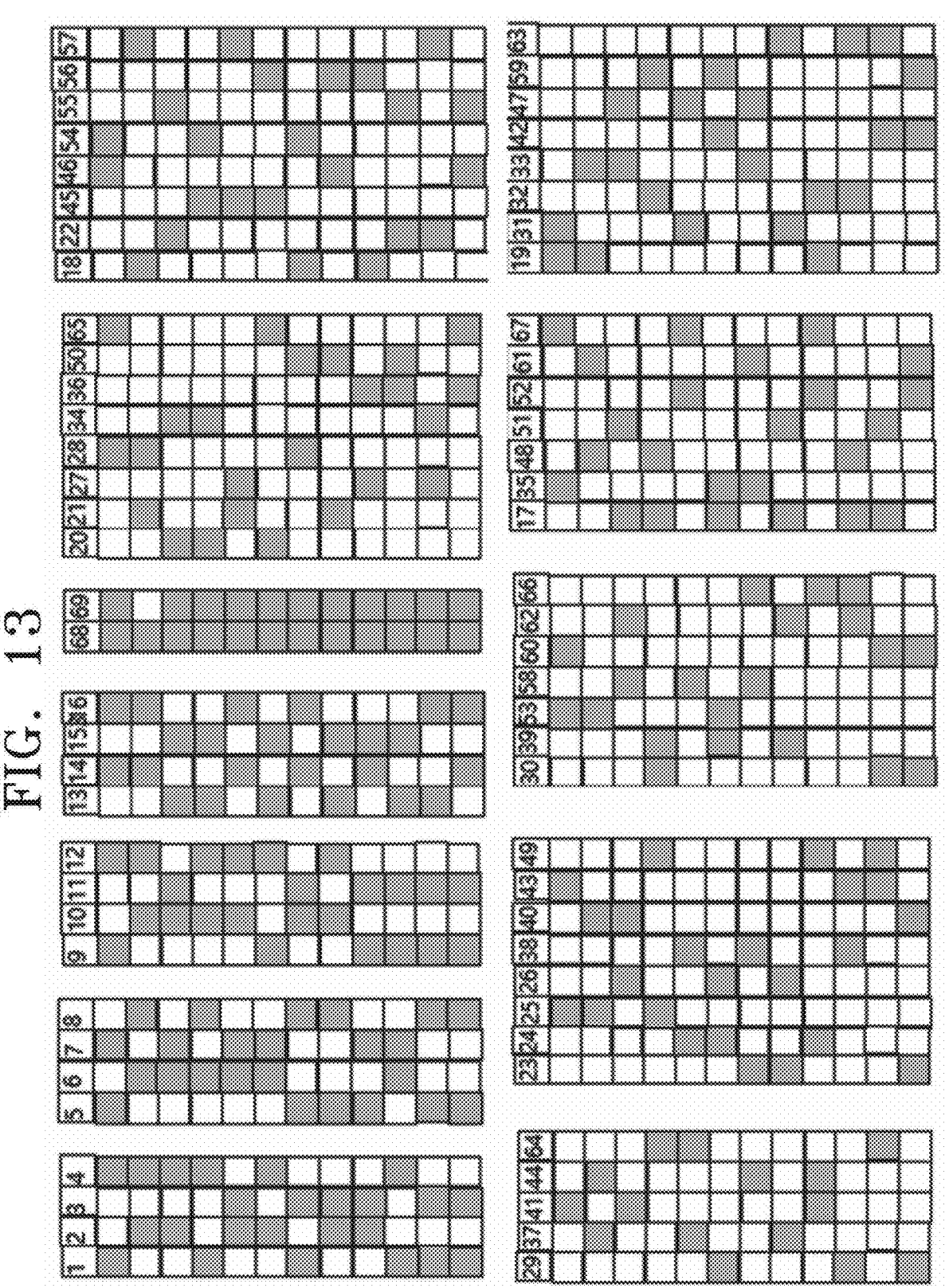
FIG. 13 is a diagram illustrating a structure of a second stage of parallelization of a parity check matrix according to the present invention.

FIG. 13 is a diagram illustrating a structure of a second stage of parallelization of a parity check matrix according to the present invention.

As shown in FIG. 13, in the second stage of parallelization, 69 column blocks are grouped into a total of 12 phases. In this case, each phase is provided such that the number of each of check nodes and variable nodes is up to 2. In the second stage of parallelization, 12 phases are used, and thus 16 clock cycles are used for one iterative decoding. Therefore, the second stage of parallelization may provide eight iterative decodings within 135 clock cycles. That is, in the present invention, when the second stage of parallelization is used, a hardware resources may be increased by about 35%, and the number of iterative decodings may be expanded by four times.

Figure 14:
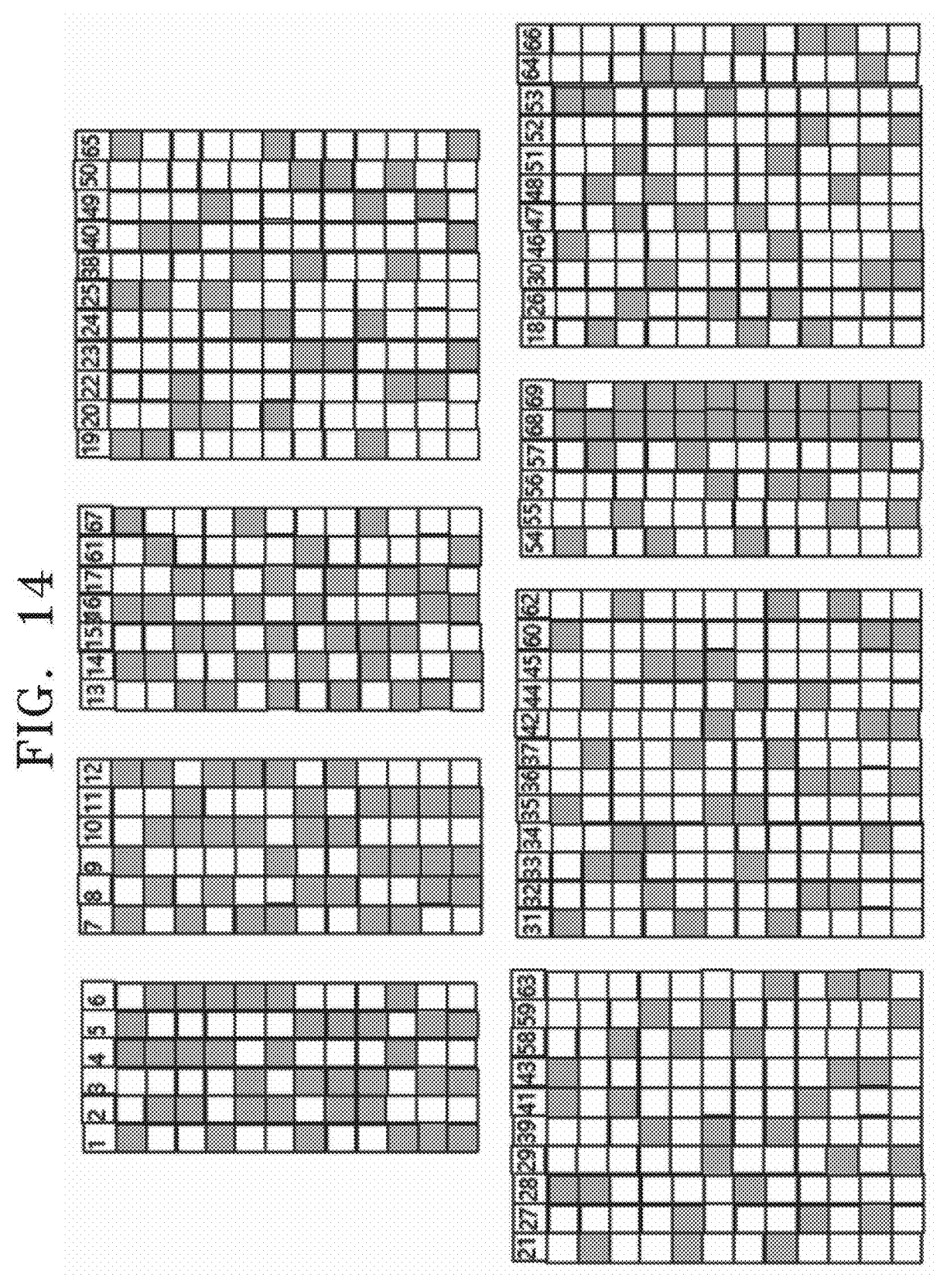

FIG. 14 is a diagram illustrating a structure of a third stage of parallelization of a parity check matrix according to the present invention.

As shown in FIG. 14, in the third stage of parallelization, 69 column blocks are grouped into a total of 8 phases. In this case, each phase is provided such that the number of each of check nodes and variable nodes is up to 3. In the third stage of parallelization, 8 phases are used, and thus 12 clock cycles are used for one iterative decoding. Therefore, the third stage of parallelization may provide eleven iterative decodings within 135 clock cycles. That is, in the present invention, when the third stage of parallelization is used, a hardware resource may be increased by about 75%, and the number of iterative decodings may be expanded by six times.

As such, in the present invention, as a state of parallelization becomes higher, an amount of use of hardware resources is increased, but the number of iterative decodings is increased, thereby improving BER performance. Therefore, in the present invention, in consideration of BER performance required by a system, it is possible to provide a stage of parallelization capable of providing a required number of iterative decodings.

According to embodiments of the present invention, by performing a hardware optimization for an LDPC through a pipeline method and parallelization of a sparse parity check matrix in a 50G PON, in the 50G PON, error correction performance can be ensured while optimally using hardware resources.

According to embodiments of the present invention, a 50 Gbps low-density parity check decoding function can be provided with limited hardware resources.

According to embodiments of the present invention, an LDPC decoder can be operated at 50 Gbps by dividing a parity check matrix into 69 phases and adopting a 5-stage pipeline structure in each phase.

According to embodiments of the present invention, by adopting a parallelization structure capable of increasing the number of iterative decodings, error correction performance of an LDPC decoder can be improved within limited hardware resources.

The present invention has been described with reference to embodiments shown in the drawings, but this is merely illustrative, and those skilled in the art will understand that various modifications and other equivalent embodiments are possible therefrom. Therefore, the technical protection scope of the present invention should be defined by the appended claims.

What is claimed is:

1. A hardware optimization device for optimizing a hardware of a low-density parity check (LDPC) decoder, comprising:

a variable node hardware block configured to operate in a multi-stage pipeline structure for updating a variable node message delivered to each variable node; and a check node hardware block configured to operate in a multi-stage pipeline structure for updating a check node message delivered to each check node, wherein the variable node hardware block and the check node hardware block divide a parity check matrix into N column blocks for the update (N is a natural number of 2 or more), repeatedly perform calculations for the variable node and the check node for each of the divided column blocks, and perform different calculations for variable nodes according to respective phases each corresponding to one of the divided column blocks, through a pipeline method, wherein each of the respective phases comprise both the variable node calculations and the check node calculations for the corresponding column block, wherein each of the respective phases comprise a plurality of pipeline stages, wherein a first pipeline stage of an $M^{th}$ respective phase (M is a natural number of 2 or more) is calculated in parallel to a second pipeline stage of an $M^{th}-1$ respective phase, and wherein the phase is divided to sequentially perform the variable node calculations and the check node calculations for the corresponding column block.

2. The hardware optimization device of claim 1, wherein the phase is an operation for each of the column blocks and is used as many times as the number of the column blocks for one iterative decoding.

3. The hardware optimization device of claim 1, wherein the variable node hardware block and the check node hardware block make the phase into a plurality of pipeline stages and consecutively perform two adjacent phase calculations with a timing offset as much as one clock cycle corresponding to one stage of the plurality of pipeline stages.

4. The hardware optimization device of claim 1, wherein the variable node hardware block and the check node hardware block increase the number of iterative decodings possible within a given time through parallelization of the parity check matrix based on grouping of the column blocks.

5. The hardware optimization device of claim 4, wherein the variable node hardware block and the check node hardware block group the N column blocks to constitute the M phases (M is a natural number of 2 or more).

6. The hardware optimization device of claim 5, wherein the variable node hardware block and the check node hardware block perform log-likelihood ratio (LLR) update of each bit of the variable node message and the check node message through iterative decoding using the M phases and perform error correction in a given clock cycle.

7. The hardware optimization device of claim 4, wherein each of the phases is provided such that the maximum number of each of check nodes and variable nodes is determined according to a grouping number of the column blocks.

8. The hardware optimization device of claim 1, wherein the variable node hardware block and the check node hardware block constitute iterative decoding by delivering the updated message to an adjacent node through an edge connecting the variable node and the check node.

9. The hardware optimization device of claim 8, wherein, when a value of the parity check matrix is 1, the edge is connected between the variable node and the check node.

10. The hardware optimization device of claim 1, wherein, in order to optimize hardware resources, the variable node hardware block and the check node hardware block define a bit width of each of a channel log-likelihood ratio (LLR), a soft LLR message (VCM) delivered from the variable node hardware block to the check node hardware block, and a soft LLR message (CVM) delivered from the check node hardware block to the variable node hardware block with 4 bits including a sign bit, wherein, for an internal calculation, the variable node hardware block defines the bit width of each of the channel LLR, the VCM, and the CVM with 7 bits including the sign bit.

11. A hardware optimization method for a low-density parity check (LDPC) decoder including a variable node hardware block configured to operate in a multi-stage pipeline structure for updating a variable node message delivered to each variable node, and a check node hardware block configured to operate in a multi-stage pipeline structure for updating a check node message delivered to each check node, the hardware optimization method comprising:

dividing a parity check matrix into N column blocks; and repeatedly performing calculations for the variable node and the check node for each of the divided column blocks, wherein different calculations for variable nodes are performed according to respective phases each corresponding to one of the divided column blocks, through a pipeline method, wherein each of the respective phases comprise both the variable node calculations and the check node calculations for the corresponding column block, wherein each of the respective phases comprise a plurality of pipeline stages, wherein a first pipeline stage of an $M^{th}$ respective phase (M is a natural number of 2 or more) is calculated in parallel to a second pipeline stage of an $M^{th}-1$ respective phase, and wherein the phase is divided to sequentially perform the variable node calculations and the check node calculations for the corresponding column block.

12. The hardware optimization method of claim 11, wherein the phase is an operation for each of the column blocks and is used as many times as the number of the column blocks for one iterative decoding.

13. The hardware optimization method of claim 11, wherein the variable node hardware block and the check node hardware block make the phase into a plurality of pipeline stages and consecutively perform two adjacent phase calculations with a timing offset as much as one clock cycle corresponding to one stage of the plurality of pipeline stages.

14. The hardware optimization method of claim 11, wherein the variable node hardware block and the check node hardware block increase the number of possible iterative decodings within a given time through parallelization of the parity check matrix based on grouping of the column blocks.

15. The hardware optimization method of claim 14, wherein the variable node hardware block and the check node hardware block group the N column blocks to constitute the M phases.

16. The hardware optimization method of claim 15, wherein the variable node hardware block and the check node hardware block perform log-likelihood ratio (LLR) update of each bit of the variable node message and the check node message through iterative decoding using the M phases and perform error correction in a given clock cycle.

17. The hardware optimization method of claim 14, wherein each of the phases is provided such that the maximum number of each of check nodes and variable nodes is determined according to a grouping number of the column blocks.

18. The hardware optimization method of claim 11, wherein the variable node hardware block and the check node hardware block constitute iterative decoding by delivering the updated message to an adjacent node through an edge connecting the variable node and the check node.

19. The hardware optimization method of claim 18, wherein, when a value of the parity check matrix is 1, the edge is connected between the variable node and the check node.

20. The hardware optimization method of claim 11, wherein, in order to optimize hardware resources, the variable node hardware block and the check node hardware block define a bit width of each of a channel log-likelihood ratio (LLR), a soft LLR message (VCM) delivered from the variable node hardware block to the check node hardware block, and a soft LLR message (CVM) delivered from the check node hardware block to the variable node hardware block with 4 bits including a sign bit, wherein, for an internal calculation, the variable node hardware block defines the bit width of each of the channel LLR, the VCM, and the CVM with 7 bits including the sign bit.

* * * * *